United States Patent
Howland

(10) Patent No.: US 6,657,454 B2
(45) Date of Patent: Dec. 2, 2003

(54) HIGH SPEED THRESHOLD VOLTAGE AND AVERAGE SURFACE DOPING MEASUREMENTS

(75) Inventor: William H. Howland, Wexford, PA (US)

(73) Assignee: Solid State Measurements, Inc., Pittsburgh, PA (US)

(*) Notice: Subject to any disclaimer, the term of this patent is extended or adjusted under 35 U.S.C. 154(b) by 0 days.

(21) Appl. No.: 10/099,207

(22) Filed: Mar. 15, 2002

(65) Prior Publication Data

US 2003/0173988 A1 Sep. 18, 2003

(51) Int. Cl.$^7$ .............................................. G01R 27/26
(52) U.S. Cl. .................................... 324/765; 324/158.1
(58) Field of Search ............................... 324/765, 158.1, 324/754, 769, 750, 751, 752, 753; 438/17–19; 257/440; 250/310, 311, 492.2; 356/237

(56) References Cited

U.S. PATENT DOCUMENTS

| | | | |
|---|---|---|---|
| 4,325,025 A | 4/1982 | Corcoran et al. | 324/158 R |
| 4,509,012 A * | 4/1985 | Lin | 324/767 |
| 4,812,756 A | 3/1989 | Curtis et al. | 324/158 R |
| 4,891,584 A * | 1/1990 | Kamieniecki et al. | 324/752 |
| 5,216,362 A | 6/1993 | Verkuil | 324/158 D |
| 5,521,525 A | 5/1996 | Nicollian et al. | 324/765 |
| 5,874,329 A | 2/1999 | Neary et al. | 438/203 |
| 6,011,404 A | 1/2000 | Ma et al. | 324/765 |
| 6,069,485 A | 5/2000 | Long et al. | 324/769 |
| 6,107,108 A | 8/2000 | Chen et al. | 438/14 |
| 6,111,300 A | 8/2000 | Cao et al. | 257/440 |
| 6,197,624 B1 | 3/2001 | Yamazaki | 438/158 |
| 6,232,619 B1 | 5/2001 | Chen et al. | 257/48 |
| 6,255,128 B1 | 7/2001 | Chacon et al. | 438/17 |
| 6,261,889 B1 | 7/2001 | Ono | 438/232 |
| 6,265,890 B1 | 7/2001 | Chacon et al. | 324/765 |

* cited by examiner

Primary Examiner—Kamand Cuneo
Assistant Examiner—Jimmy Nguyen
(74) Attorney, Agent, or Firm—Webb Ziesenheim Logsdon Orkin & Hanson, P.C.

(57) ABSTRACT

A method for measuring threshold voltage and average surface doping concentration of a semiconductor wafer begins by exposing a measurement site to a high intensity light immediately before a measurement sweep begins. A CV measurement sweep is made with the voltage increasing to a maximum voltage, and the response of the semiconductor wafer to CV measurement sweep is recorded. When the voltage is at the maximum voltage, the light is turned off and the capacitance of the measurement site in the absence of light is measured until the capacitance reaches equilibrium. From the recorded response, the threshold voltage and the average surface doping concentration are determined.

3 Claims, 2 Drawing Sheets

HIGH SPEED THRESHOLD VOLTAGE AND AVERAGE SURFACE DOPING MEASUREMENTS

BACKGROUND OF THE INVENTION

1. Field of the Invention

This invention relates generally to a method for measuring electrical properties of a semiconductor wafer and, more particularly, for high speed measuring of threshold voltage and average surface doping.

2. Description of Related Art

Conventional methods of characterizing the quality of a dielectric formed on a silicon surface of a semiconductor wafer include capacitance-voltage (CV) techniques. Measurements of threshold voltage and average surface doping concentration are taken in this manner. Specifically, CV measurements require that a measurement site on and adjacent the silicon surface of the semiconductor wafer be first biased into deep depletion, a non-equilibrium condition. The measurement site must then be returned to thermodynamic equilibrium before threshold voltage and average surface doping can be measured. Equilibrium is reached by exposing the measurement site to a light source after it reaches deep depletion.

With reference to FIG. 1, heretofore, a CV curve 8 was generated by superimposing an AC signal on a DC signal and changing the DC signal applied to the measurement site from a starting voltage having a first polarity to an ending voltage having a second, opposite polarity and measuring the resultant capacitance. When the starting voltage is applied, an accumulation region is observed of approximately constant capacitance 10. As the voltage approaches zero and changes polarity, the capacitance decreases as the measurement site becomes biased into depletion 12 and this capacitance eventually reaches deep depletion 14. At deep depletion 14, a light is directed at the measurement site while the voltage is held constant 16 whereupon the measurement site returns to equilibrium 18. When the measurement site reaches equilibrium 18, the light is turned off and the voltage is decreased 20 toward zero. The capacitance levels off during this stage. From the thus derived CV curve, threshold voltage and average surface doping can be determined in manners known in the art.

This process provides a slow means for reaching equilibrium, taking approximately ½ minute for measurement. However, for production speed, threshold voltage and average surface doping must be measured very quickly, on the order of seconds. Therefore, a need exists for a method for measuring threshold voltage and average surface doping quickly.

It is, therefore, an object of this invention to provide an improved method for reaching equilibrium whereupon threshold voltage and average surface doping concentration can be calculated quicker (i.e., on the order of seconds), as compared to the conventional methods.

SUMMARY OF THE INVENTION

A method according to the present invention includes exposing a measurement site to a high intensity light immediately before a measurement sweep begins. A CV measurement sweep is then made with the voltage increasing from zero volts to its maximum positive or negative voltage. (A maximum positive voltage is used for p-type silicon whereas a maximum negative voltage is used for n-type silicon.) When the voltage reaches its maximum voltage, the light is turned off and the response of the measurement site to the absence of light thereon is measured until the capacitance reaches equilibrium.

The method allows thermodynamic equilibrium to be reached very quickly after the CV measurement sweep and, thereby, for very high speed threshold voltage and average surface doping concentration measurements.

DESCRIPTION OF THE PREFERRED EMBODIMENT

Figure 1:
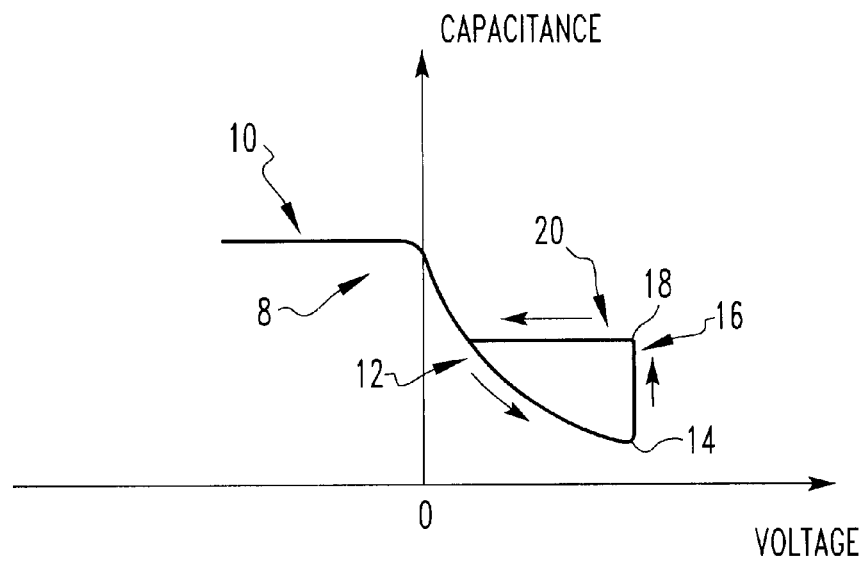
FIG. 1 is a CV graph of a conventional method for calculating threshold voltage and average surface doping concentration on a semiconductor wafer.

A complete understanding of the invention will be obtained from the following description when taken in connection with the accompanying drawing figures wherein like reference characters identify like parts throughout.

Figure 2:
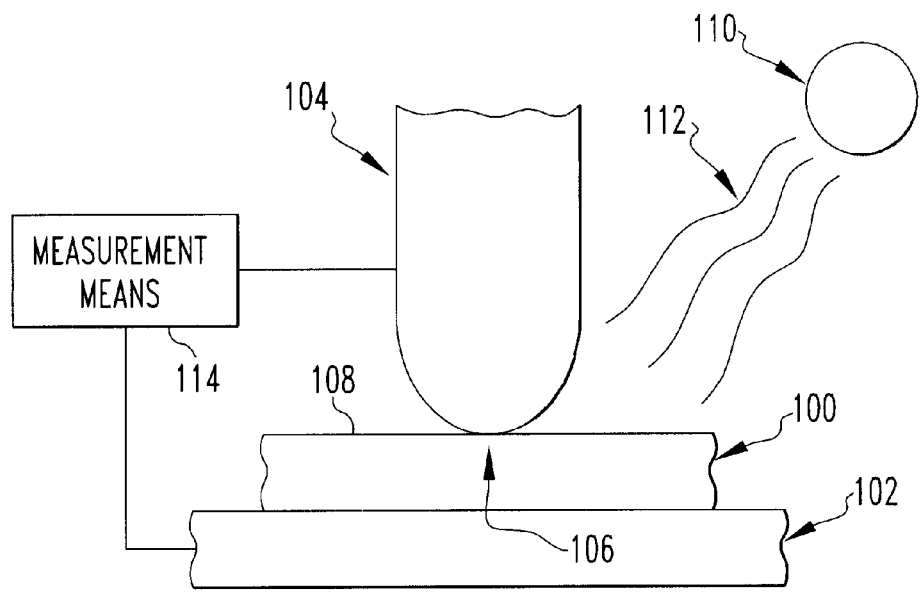
FIG. 2 is a schematic front view of an apparatus for carrying out a method according to the present invention.

Referring to FIG. 2, an apparatus for carrying out a method according to the present invention includes a semiconductor wafer 100 received on a chuck 102. A measurement probe 104 is applied to a measurement site 106 on a silicon surface 108 of semiconductor wafer 100. A light source 110, such as a xenon lamp, is positioned to direct light 112 onto measurement site 106 of semiconductor wafer 100. A measurement means 114 is connected between probe 104 and chuck 102 for applying a CV stimulus to semiconductor wafer 100 and for measuring the response of semiconductor wafer 100 to the stimulus.

Figure 3:
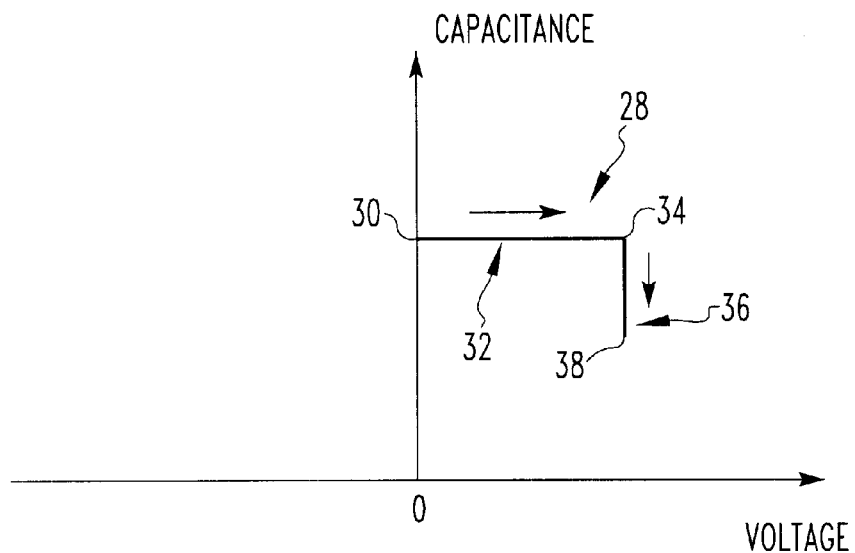
FIG. 3 is a CV graph of a method according to the present invention for calculating threshold voltage and average surface doping concentration on a semiconductor wafer.

Referring to FIG. 3, a CV curve 28 is generated by directing light toward measurement site 106 on silicon surface 108 of semiconductor wafer 100 before a CV measurement sweep begins. A CV measurement sweep 32 is then applied to measurement site 106, with the voltage being swept from zero volts to a maximum negative or positive voltage depending on whether semiconductor wafer 100 is formed from n-type silicon or p-type silicon, respectively. The capacitance is level during this sweep. When the maximum voltage is reached, light source 110 is turned off 34 and the voltage is held constant 36. The capacitance of measurement site 106 is measured until it reaches equilibrium 38. From this CV curve, threshold voltage and average doping surface concentration can be determined. With this method, deep depletion is never achieved.

Figure 4:
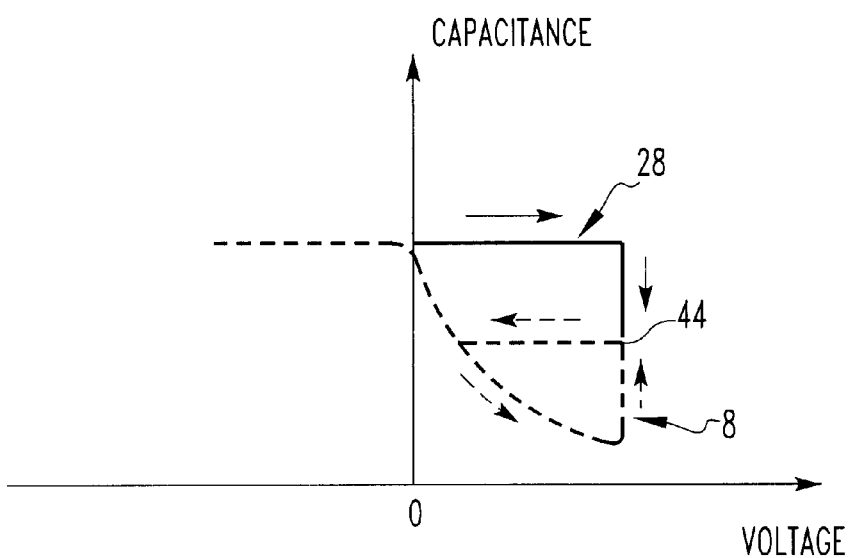
FIG. 4 is a CV graph showing the CV graphs of FIGS. 1 and 3 superimposed on each other.

Referring to FIG. 4, the CV curve 28 generated by the present invention is graphed with the CV curve 8 generated by conventional methods. Equilibrium of the silicon surface of the semiconductor wafer is designated as 44.

It will be understood by those skilled in the art that while the foregoing description sets forth in detail the preferred embodiment of the present invention, modifications, additions, and changes might be made thereto without departing from the spirit and scope of the invention.

The invention claimed is:

1. A method for measuring electrical properties of a semiconductor wafer, comprising the steps of:

a) exposing a silicon surface of a measurement site of a semiconductor wafer to light;
b) sweeping a DC voltage having an AC voltage superimposed thereon from a first voltage to a second voltage;
c) terminating receipt of the light by the silicon surface when the second voltage is achieved;
d) holding the second voltage constant until the measurement site reaches equilibrium;
e) measuring capacitance of the semiconductor wafer as a function of the second voltage applied in step d); and
f) calculating the electrical properties of the semiconductor wafer from the measurement taken in step e).

2. The method as set forth in claim 1, wherein the electrical properties are threshold voltage and average surface doping concentration.

3. The method as set forth in claim 1, wherein the second voltage is a maximum negative or positive voltage based on whether the semiconductor wafer is formed from n-type silicon or p-type silicon, respectively.

* * * * *